(12) United States Patent
Balakrishnan et al.

(10) Patent No.: US 9,917,179 B2
(45) Date of Patent: Mar. 13, 2018

(54) STACKED NANOWIRE DEVICES FORMED USING LATERAL ASPECT RATIO TRAPPING

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/220,723

(22) Filed: Jul. 27, 2016

(65) Prior Publication Data

US 2017/0092736 A1 Mar. 30, 2017

Related U.S. Application Data

(62) Division of application No. 14/869,118, filed on Sep. 29, 2015, now Pat. No. 9,484,405.

(51) Int. Cl.
*H01L 29/78* (2006.01)
*H01L 29/66* (2006.01)
(Continued)

(52) U.S. Cl.
CPC ...... *H01L 29/6681* (2013.01); *H01L 21/0243* (2013.01); *H01L 21/0262* (2013.01);
(Continued)

(58) Field of Classification Search
CPC .............. H01L 29/1037; H01L 29/785; H01L 29/0673

See application file for complete search history.

(56) References Cited

U.S. PATENT DOCUMENTS 8,063,450 B2 11/2011 Wernersson et al.
8,154,082 B2 4/2012 Moriyama et al.
(Continued)

FOREIGN PATENT DOCUMENTS

WO 2016105437 A1 6/2016

*Primary Examiner* — Mark Prenty
(74) *Attorney, Agent, or Firm* — Louis J. Percello; Ryan, Mason & Lewis, LLP

(57) ABSTRACT

A method for manufacturing a semiconductor device comprises depositing alternating layers of a plurality of first dielectric layers and a plurality of second dielectric layers on a substrate in a stacked configuration, forming one or more first openings in the stacked configuration to a depth penetrating below an upper surface of a bottom second dielectric layer of the plurality of second dielectric layers, forming one or more second openings in the stacked configuration to a depth corresponding to an upper surface of the substrate or below an upper surface of the substrate, removing the plurality of second dielectric layers from the stacked configuration to form a plurality of gaps, and epitaxially growing a semiconductor material from a seed layer in the one or more second openings to fill the one or more first and second openings and the plurality of gaps, wherein defects caused by a lattice mismatch between the epitaxially grown semiconductor material and a material of the substrate are contained at a bottom portion of the one or more second openings.

14 Claims, 8 Drawing Sheets

(51) Int. Cl.
  *H01L 29/06* (2006.01)
  *H01L 29/423* (2006.01)
  *H01L 29/786* (2006.01)
  *H01L 21/02* (2006.01)
  *H01L 21/311* (2006.01)

(52) U.S. Cl.
  CPC .. *H01L 21/02381* (2013.01); *H01L 21/02499* (2013.01); *H01L 21/02532* (2013.01); *H01L 21/02538* (2013.01); *H01L 21/02603* (2013.01); *H01L 21/02639* (2013.01); *H01L 21/02647* (2013.01); *H01L 21/31111* (2013.01); *H01L 21/31116* (2013.01); *H01L 29/0673* (2013.01); *H01L 29/42392* (2013.01); *H01L 29/66545* (2013.01); *H01L 29/66742* (2013.01); *H01L 29/7853* (2013.01); *H01L 29/78696* (2013.01); *H01L 21/02551* (2013.01)

(56) References Cited

U.S. PATENT DOCUMENTS

| | | | |
|---|---|---|---|
| 8,617,412 | B2 | 12/2013 | Anderson et al. |
| 8,674,342 | B2 | 3/2014 | Sleight et al. |
| 8,765,563 | B2 | 7/2014 | Pillarisetty et al. |
| 8,796,742 | B1 | 8/2014 | Chang et al. |
| 8,900,935 | B2 | 12/2014 | Guo et al. |
| 8,956,959 | B2 | 2/2015 | Sekar et al. |
| 9,123,567 | B2 * | 9/2015 | Radosavljevic ................. H01L 21/823807 |
| 9,478,611 | B2 | 10/2016 | Chan et al. |
| 9,484,405 | B1 * | 11/2016 | Balakrishnan ...... H01L 29/0673 |
| 9,640,394 | B2 * | 5/2017 | Caimi ............... H01L 21/02647 |
| 2013/0285019 | A1 | 10/2013 | Kim et al. |
| 2015/0069328 | A1 | 3/2015 | Leobandung |
| 2016/0351391 | A1 | 12/2016 | Borg et al. |

\* cited by examiner

STACKED NANOWIRE DEVICES FORMED USING LATERAL ASPECT RATIO TRAPPING

TECHNICAL FIELD

The field generally relates to semiconductor devices including stacked nanowires and methods of manufacturing same and, in particular, to semiconductor devices including stacked nanowires formed using aspect ratio trapping.

BACKGROUND

A nanowire is a relatively thin wire, for example, with a diameter or width measured in nanometers (nm). Nanowires can have diameters or widths such as, for example, about 4 nm to 10 nm.

Nanowires can be a viable device option instead of fin field-effect transistors (FinFETs). For example, a nanowire can be used as the fin structure in a dual-gate, tri-gate or gate-all-around (GAA) FET device. Nanowires can have a smaller perimeter than fins, but also larger external resistance due to an under-spacer component.

Complementary metal-oxide semiconductor (CMOS) scaling can be enabled by the use of stacked nanowires, which offer superior electrostatics and higher current density per footprint area than FinFETs. III-V channel materials exhibit high mobility for electrons and germanium (Ge) channel materials exhibit high mobility for holes, which can result in higher performance.

SUMMARY

According to an exemplary embodiment of the present invention, a method for manufacturing a semiconductor device comprises depositing alternating layers of a plurality of first dielectric layers and a plurality of second dielectric layers on a substrate in a stacked configuration, forming one or more first openings in the stacked configuration to a depth penetrating below an upper surface of a bottom second dielectric layer of the plurality of second dielectric layers, forming one or more second openings in the stacked configuration to a depth corresponding to an upper surface of the substrate or below an upper surface of the substrate, removing the plurality of second dielectric layers from the stacked configuration to form a plurality of gaps, and epitaxially growing a semiconductor material from a seed layer in the one or more second openings to fill the one or more first and second openings and the plurality of gaps, wherein defects caused by a lattice mismatch between the epitaxially grown semiconductor material and a material of the substrate are contained at a bottom portion of the one or more second openings.

According to an exemplary embodiment of the present invention, a semiconductor device comprises a substrate, a plurality of nanowires on the substrate in a stacked configuration, wherein the nanowires comprise a material having a lattice mismatch with a material of the substrate and are free of dislocation defects, and a gate structure formed on the stacked configuration.

According to an exemplary embodiment of the present invention, a method for manufacturing a semiconductor device comprises depositing alternating layers of a plurality of first dielectric layers and a plurality of second dielectric layers on a substrate in a stacked configuration, forming one or more first openings in the stacked configuration to a depth penetrating below an upper surface of a bottom second dielectric layer of the plurality of second dielectric layers, forming one or more second openings in the stacked configuration to a depth corresponding to an upper surface of the substrate or below an upper surface of the substrate, removing the plurality of second dielectric layers from the stacked configuration to form a plurality of gaps, and epitaxially growing a semiconductor material from a seed layer in the one or more second openings to fill the one or more first and second openings and the plurality of gaps, wherein the epitaxially grown semiconductor material in at least the plurality of gaps is free of defects caused by a lattice mismatch between the epitaxially grown semiconductor material and a material of the substrate.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
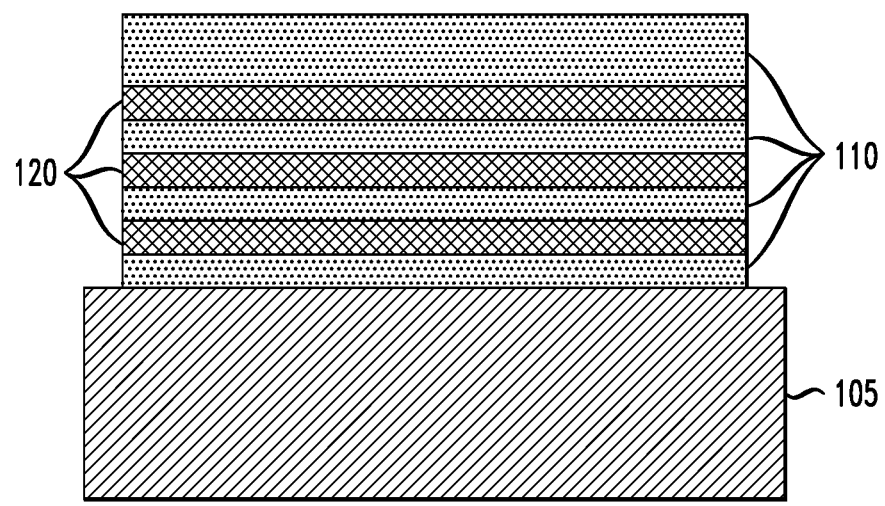
FIG. 1 is a cross-sectional view illustrating fabrication of a semiconductor device taken parallel to a gate extension direction and showing deposition of alternating dielectric layers on a semiconductor substrate, according to an exemplary embodiment of the present invention.

Exemplary embodiments of the invention will now be discussed in further detail with regard to semiconductor devices including stacked nanowire devices and methods of manufacturing same and, in particular, to stacked nanowire CMOS devices that are formed using lateral aspect ratio trapping.

It is to be understood that the various layers and/or regions shown in the accompanying drawings are not drawn to scale, and that one or more layers and/or regions of a type commonly used in CMOS, fin field-effect transistor (FinFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The stacked nanowire devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the stacked nanowire devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require stacked nanowire FETs. By way of non-limiting example, the semiconductor devices can include, but are not limited to, CMOS devices, MOSFET devices, FinFET devices, and/or semiconductor devices that do not use FinFET technology.

As used herein, "parallel to a gate extension direction" refers to an extension direction of a gate structure perpendicular to a channel length (e.g., perpendicular to a nanowire extension direction) and to the left and right in the cross-sectional views herein, wherein source/drain regions would be located in front and behind the cross-sectional views. In other words, left and right in these cross-sections represents a width or diameter direction of the nanowire, and the length of the nanowire and a channel length are going into the page.

As used herein, "perpendicular to a gate extension direction" or "across a channel of a gate structure" refers to a channel length direction of a gate structure (e.g., parallel to a nanowire extension direction).

As used herein, "height" refers to a vertical size of an element (e.g., a layer, trench, hole, etc.) in the cross-sectional figures measured from a bottom surface to a top surface of the element, and/or measured with respect to a surface on which the element is directly on. Conversely, a "depth" refers to a vertical size of an element (e.g., a layer, trench, hole, etc.) in the cross-sectional figures measured from a top surface to a bottom surface of the element.

As used herein, "lateral," "lateral side," "lateral surface" refers to a side surface of an element (e.g., a layer, etc.), such as a left or right side surface in the cross-sectional figures.

As used herein, "width" refers to a horizontal size of an element (e.g., a layer, trench, hole, etc.) in the figures measured from a left or right side surface to an opposite surface of the element.

Embodiments of the present invention describe ways of fabricating III-V compound semiconductor and/or germanium stacked nanowire FETs. III-V compound semiconductor materials are obtained by combining Group III elements (e.g., aluminum (Al), gallium (Ga), and indium (In)) with Group V elements (e.g., nitrogen (N), phosphorous (P), arsenic (As), and antimony (Sb)). When making III-V channel material devices on a silicon (Si) substrate, defects can be an issue due to a lattice mismatch between silicon and III-V materials, such as, for example, Indium gallium arsenide (InGaAs). When making germanium channel material devices on a silicon substrate, defects can be an issue due to a lattice mismatch between silicon and germanium. The embodiments of the present invention are not necessarily limited to III-V compound semiconductor materials or germanium, and may be applied in connection with any semiconductor materials that have a lattice mismatch with silicon, such as for example, II-VI semiconductor materials.

In accordance with one or more embodiments of the present invention, in order to prevent defects, lateral epitaxial overgrowth can be used to fabricate stacked nanowire FETs. For example, III-V n-type FET (NFET) and germanium p-type FET (PFET) stacked nanowire devices are formed using lateral aspect ratio trapping. Channel material is grown from a seed layer formed in a silicon substrate to fill a nanowire area.

The aspect ratio of an opening can be defined as the relationship between a height (H) of the opening and a width (W) of the opening, where the aspect ratio (AR) is:

$$AR=H/W \quad (1).$$

Figure 15A:
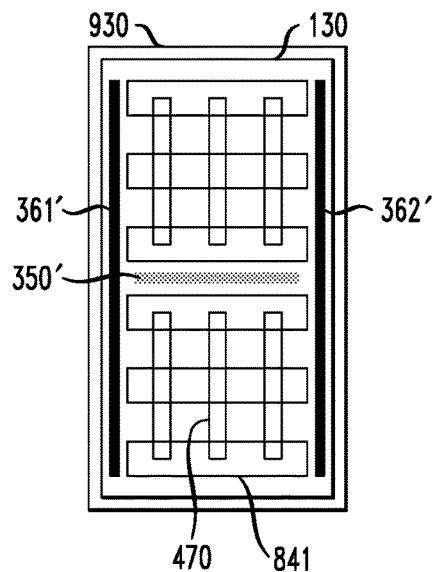
FIGS. 15A and 15B are top views of layouts of PFET and NFET semiconductor devices, respectively, according to an exemplary embodiment of the present invention.
Figure 15B:
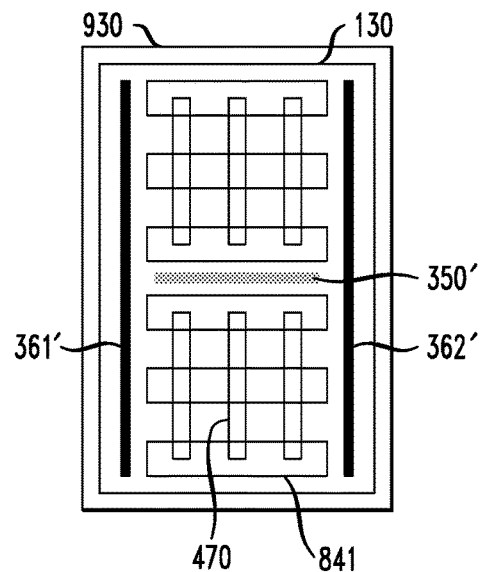

As used herein, an "opening" can be, for example, a hole or a trench, the trench being relatively longer than a hole, as can be seen, for example, in FIGS. 15A and 15B.

As used herein, a "high aspect ratio" opening can refer to an element which has a relatively large height (or depth) and a relatively small width. For example, an opening having a high aspect ratio can have a height such as about 100 nm-about 500 nm and a width such as about 10 nm-about 25 nm. It is to be understood the embodiments of the present invention are not necessarily limited to the aforementioned heights and widths, and other height and width combinations forming a high aspect ratio may be used. In accordance with embodiments of the present invention, openings discussed herein having an appropriately high aspect ratio for performing lateral aspect ratio trapping can have an aspect ratio in the range of 5:1 to 100:1.

As noted above, when making III-V and germanium channel material devices on a silicon (Si) substrate, defects can be an issue due to a lattice mismatch between silicon and the III-V and germanium materials. With aspect ratio trapping, the III-V or germanium materials are epitaxially grown in a high aspect ratio opening, and, due to the relatively small width of the opening, dislocations caused by lattice mismatch are trapped at sidewalls of the opening at a bottom portion thereof. As a result, dislocations are eliminated, or at a minimum greatly reduced at upper portions of the opening. In other words, as epitaxial growth proceeds from a bottom of a high aspect ratio opening, the dislocations are contained at a bottom of the opening by the sidewalls of the opening, so that material that is grown above a certain point in the opening is free of dislocations.

FIG. 1 is a cross-sectional view illustrating fabrication of a semiconductor device taken parallel to a gate extension direction and showing deposition of alternating dielectric layers on a semiconductor substrate, according to an exemplary embodiment of the present invention. A semiconductor substrate 105 can be, for example, a bulk substrate or a silicon-on-insulator (SOI) substrate including a buried insulating layer, such as, for example, a buried oxide or nitride layer located on an upper surface of the semiconductor substrate. The substrate 105 may comprise semiconductor material including, but not limited to, Si, SiGe, SiC, SiGeC or other like semiconductor. In addition, multiple layers of the semiconductor materials can be used as the semiconductor material of the substrate. In accordance with an embodiment of the present invention, as can be seen in FIG. 1, alternating layers of dielectric material 110 and 120 are deposited in an alternating and stacked configuration, so that a first dielectric layer 110 is followed a second dielectric layer 120 on the first dielectric layer 110, which is followed by another layer of the first dielectric and another layer of the second dielectric, and so on. According to an embodiment of the present invention, the first dielectric 110 comprises a nitride, and the second dielectric 120 comprises an oxide. The embodiments of the present invention are not necessarily limited to the shown number of layers 110, 120, and there may be more or less layers in the same alternating configuration depending on design constraints. The nitride can include, but is not limited to, silicon nitride (SiN), and the oxide can include, but is not limited to silicon dioxide ($SiO_2$).

Figure 2:
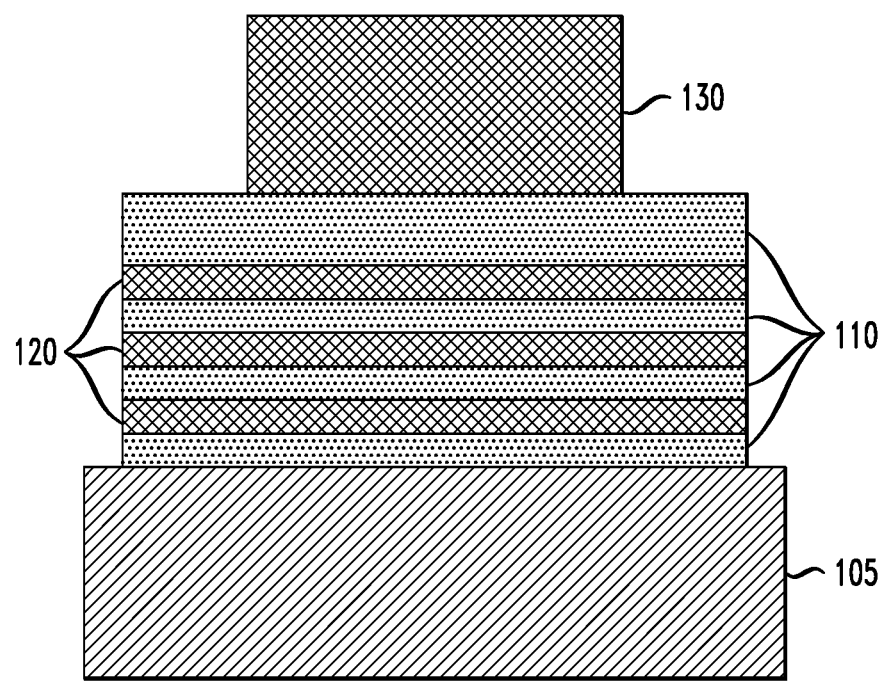
FIG. 2 is a cross-sectional view illustrating fabrication of a semiconductor device taken parallel to a gate extension direction and showing positioning of a mask on the dielectric stack from FIG. 1, according to an exemplary embodiment of the present invention.
Figure 3:
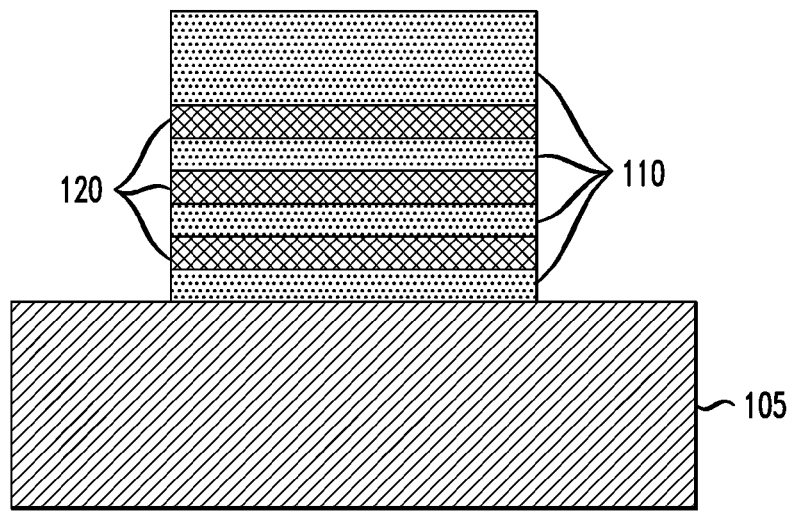
FIG. 3 is a cross-sectional view illustrating fabrication of a semiconductor device taken parallel to a gate extension direction and showing removal of exposed portions of the dielectric stack from FIG. 2, according to an exemplary embodiment of the present invention.

FIG. 2 is a cross-sectional view illustrating fabrication of a semiconductor device taken parallel to a gate extension direction and showing positioning of an isolation mask on the dielectric stack from FIG. 1, according to an exemplary embodiment of the present invention. The isolation mask 130 is deposited using, for example, a deposition technique including, but not limited to, chemical vapor deposition (CVD), plasma enhanced CVD (PECVD), physical vapor deposition (PVD), atomic layer deposition (ALD), molecular beam deposition (MBD), pulsed laser deposition (PLD), and/or liquid source misted chemical deposition (LSMCD), sputtering, and/or plating and can comprise, for example, silicon nitride, silicon dioxide, or other dielectric material. Referring to FIG. 2, the mask 130 blocks a portion of the dielectric stack, part of which will be used in connection with the formation of stacked nanowires. Referring to FIG. 3, the exposed portions of the dielectric stack are removed using, for example, an etch process such as an isotropic etching process, such as reactive ion etching (RIE), using a dilute hydrofluoric acid etch chemistry, for example.

Figure 4:
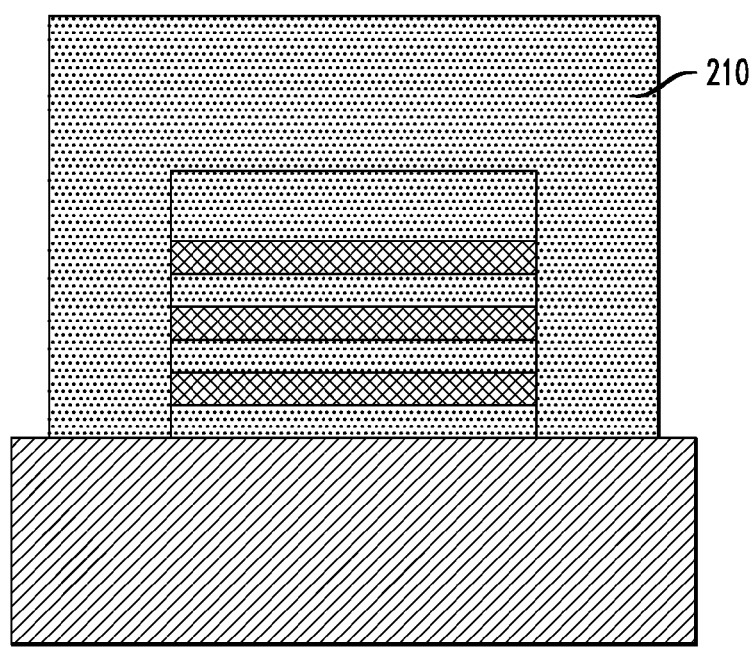
FIG. 4 is a cross-sectional view illustrating fabrication of a semiconductor device taken parallel to a gate extension direction and showing deposition of an additional layer of the first dielectric on the remaining dielectric stack from FIG. 3, according to an exemplary embodiment of the present invention.

FIG. 4 is a cross-sectional view illustrating fabrication of a semiconductor device taken parallel to a gate extension direction and showing deposition of an additional layer 210 of the first dielectric on the remaining dielectric stack from FIG. 3, according to an exemplary embodiment of the present invention. In accordance with an embodiment of the present invention, the additional dielectric layer 210 comprises nitride, so that the second dielectric layers 120 (in this example, oxide) are completely encapsulated by nitride. The additional dielectric layer 210 may have the same composition as the dielectric layer 110 and is deposited using, for example, a deposition technique including, but not limited to, CVD, PECVD, PVD, ALD, MBD, PLD, and/or LSMCD, sputtering, and/or plating. An overall width of the structure on the substrate 105 in FIG. 4 corresponds to a width of an anchor mask, which is discussed further herein in connection with FIGS. 15A, 15B, 16A and 16B.

Figure 5:
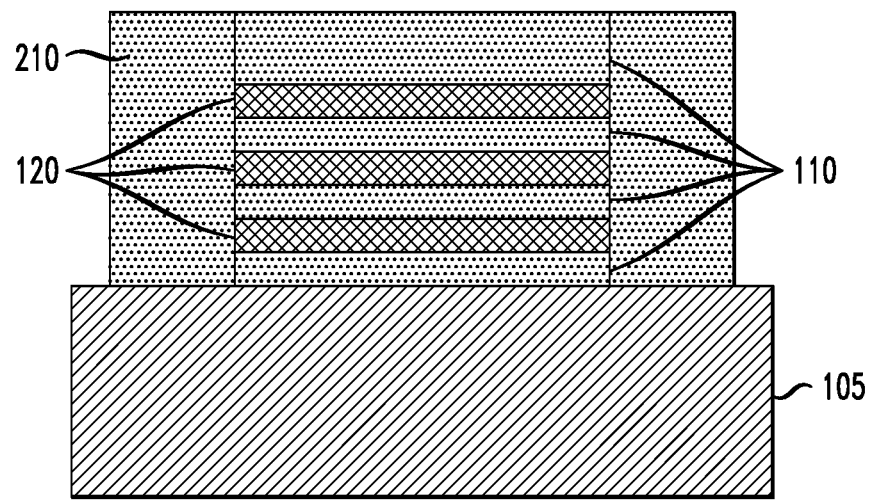
FIG. 5 is a cross-sectional view illustrating fabrication of a semiconductor device taken parallel to a gate extension direction and showing planarization to reduce a height of the structure from FIG. 4, according to an exemplary embodiment of the present invention.

FIG. 5 is a cross-sectional view illustrating fabrication of a semiconductor device taken parallel to a gate extension direction and showing planarization to reduce a height of the structure from FIG. 4, according to an exemplary embodiment of the present invention. Referring to FIG. 5, the dielectric layer 210 is planarized to a desired height, using for example, chemical mechanical planarization (CMP). Depending on the amount of dielectric that is planarized, part of a top portion of the dielectric layer 110 may also be planarized. The desired height can be based on design constraints. For example, after planarization, a height of the dielectric layer 110 (may include some of dielectric layer 210) from the top oxide layer 120 in FIG. 5 is at least 50 nm.

Figure 6:
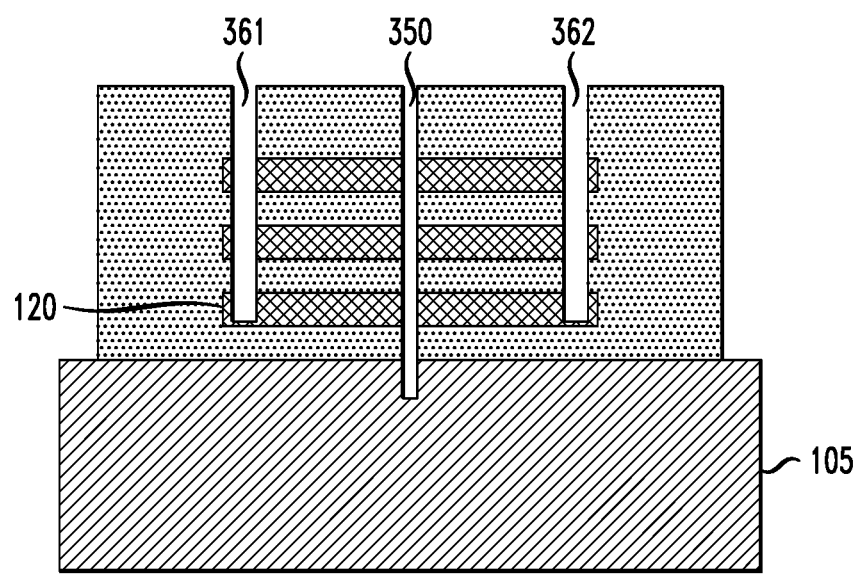
FIG. 6 is a cross-sectional view illustrating fabrication of a semiconductor device taken parallel to a gate extension direction and showing etching of openings for a seed layer and epitaxial gas outflow, according to an exemplary embodiment of the present invention.

FIG. 6 is a cross-sectional view illustrating fabrication of a semiconductor device taken parallel to a gate extension direction and showing etching of openings for a seed layer and epitaxial gas outflow, according to an exemplary embodiment of the present invention. Referring to FIG. 6, a first etch down to penetrate below an upper surface of a bottom oxide layer 120 is performed to create left and right openings 361 and 362, and a second etch is performed into a portion of the substrate 105 to create center opening 350. According to an embodiment, the etching can be stopped once the opening 350 reaches an upper surface of the substrate 105 instead of penetrating below an upper surface of the substrate 105 as shown. In addition, according to an embodiment, a bottom of the opening 350 can be formed in a V-shape. In order to form the V-shape, after etching the opening 350 to reach or penetrate below a surface of the substrate 105, a wet etch is performed with, for example, ammonia, to create the V-shape at the bottom of the opening 350.

The left and right openings 361 and 362 are for epitaxial gas outflow and the center opening 350 is where a seed layer of, for example, III-V compound semiconductor material or germanium, is formed to create a starting point for epitaxial growth of channel material. In accordance with an embodiment of the present invention, the openings 361 and 362 are etched separately from opening 350. The etching conditions for the openings 350, 361 and 362 can comprise isotropic etches, for example, RIE, using a plasma etchant, for example: $CF_4$, $SF_6$, $NF_3$, $Cl_2$, $CCl_2F_2$.

Figure 7:
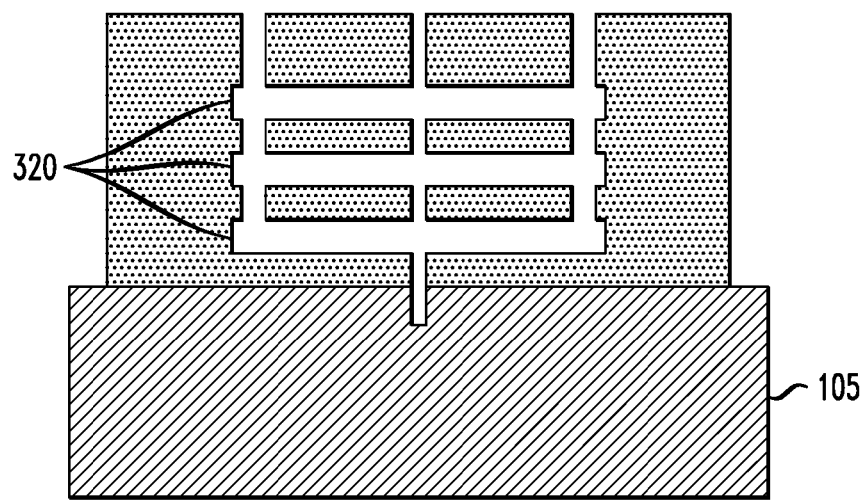
FIG. 7 is a cross-sectional view illustrating fabrication of a semiconductor device taken parallel to a gate extension direction and showing removal of a dielectric where a channel material is to be epitaxially grown, according to an exemplary embodiment of the present invention.

FIG. 7 is a cross-sectional view illustrating fabrication of a semiconductor device taken parallel to a gate extension direction and showing removal of a dielectric where a channel material is to be epitaxially grown, according to an exemplary embodiment of the present invention. Referring to FIG. 7, the dielectric layers 120 are removed by, for example, an etch process, to create gaps 320 where a channel material, such as, for example, III-V compound semiconductor material or germanium will be epitaxially grown. The etching is performed using, for example, hydrogen fluoride (HF) or a wet etch process, using, for example, tetramethylammonium-hydroxide (TMAH). In accordance with an embodiment of the present invention, the openings 361 and 362 are used to introduce the etchant.

Figure 8:
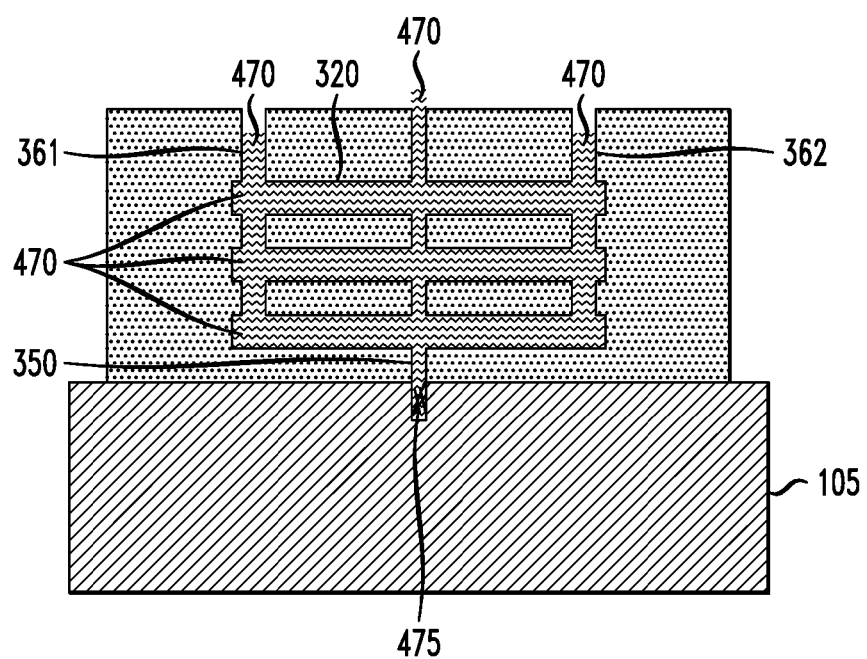
FIG. 8 is a cross-sectional view illustrating fabrication of a semiconductor device taken parallel to a gate extension direction and showing epitaxial growth of a channel material, according to an exemplary embodiment of the present invention.

FIG. 8 is a cross-sectional view illustrating fabrication of a semiconductor device taken parallel to a gate extension direction and showing epitaxial growth of a channel material, according to an exemplary embodiment of the present invention. Referring to FIG. 8, epitaxial growth starts at a seed layer at the bottom of opening 350, and continues until the channel material 470 fills the gaps 320 and openings 350, 361 and 362. As noted above, the channel material can include, but is not necessarily limited to, III-V and II-VI compound semiconductor materials or germanium. In accordance with an embodiment of the present invention, the seed layer comprises silicon from the substrate 105, and the epitaxial growth is performed using that seed layer.

As can be seen in FIG. 8, defects 475 at the interface between the substrate 105 and the channel material 470 are localized at the bottom of opening 350 due to the high aspect ratio of opening 350. In accordance with an embodiment of the present invention, an opening 350 can have an aspect ratio in the range of about 5:1 to about 100:1. As noted above, with aspect ratio trapping, due to the relatively small width of the opening 350 (e.g., left-right distance of opening 350 in FIG. 8), dislocation defects 475 caused by lattice mismatch of the channel material 470 with the substrate 105 are trapped at sidewalls of the opening 350 at a bottom portion thereof. As a result, dislocation defects are eliminated at points above the bottom portion of opening 350. In other words, as epitaxial growth proceeds from a bottom of a high aspect ratio opening, such as opening 350, the dislocation defects 475 are contained at a bottom of the opening 350 by the sidewalls of the opening 350, so that material that is grown above a certain point in the opening 350 is free of dislocations. Due to a change in direction from vertical growth to lateral growth when epitaxial growth proceeds into the gaps 320, dislocation defects are further limited and eliminated after a certain horizontal distance away from the bottom portion of the opening 350.

According to a non-limiting embodiment, growth is defect-free by no more than 1CPP (contacted poly pitch) (~30 nm in a 5 nm node) away from the seed. Embodiments of the present invention can result in little or no impact on layout density, permitting use of transistors closest to the seed layers. In accordance with embodiments of the present invention, seed openings are created at diffusion breaks.

In accordance with a non-limiting exemplary embodiment of the present invention, an opening 350 can have a height of about 100 nm-about 500 nm and a width of about 10 nm-about 25 nm.

Referring to FIG. 8, the epitaxial growth is continued until all or substantially all of the gaps 320 and openings 350, 361 and 362 are filled with the epitaxially grown semiconductor material 470. Terms such as "epitaxial growth" and "epitaxially formed and/or grown" refer to the growth of a semiconductor material on a deposition surface of a semiconductor material. Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth of the channel material. For example, epitaxial germanium can be grown from a germanium gas source that is selected from the group consisting of germane, digermane, halogermane, dichlorogermane, trichlorogermane, tetrachlorogermane and combinations thereof. Epitaxial III-V or II-VI materials can be formed from arsine, for example. Carrier gases like hydrogen, nitrogen, helium and argon can be used.

Figure 9:
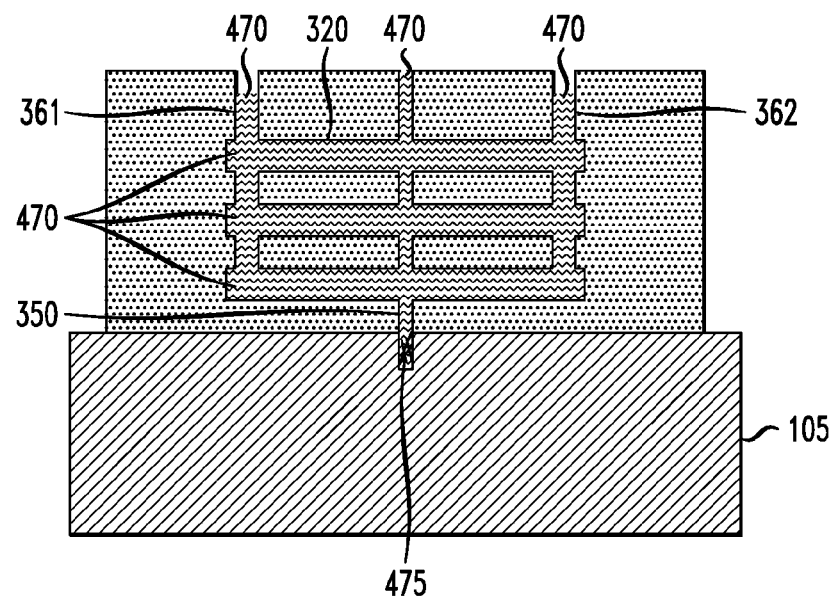
FIG. 9 is a cross-sectional view illustrating fabrication of a semiconductor device taken parallel to a gate extension direction and showing removal of part of the epitaxially grown channel material, according to an exemplary embodiment of the present invention.

FIG. 9 is a cross-sectional view illustrating fabrication of a semiconductor device taken parallel to a gate extension direction and showing removal of part of the epitaxially grown channel material, according to an exemplary embodiment of the present invention. Referring to FIG. 9, excess channel material is removed from a top portion of the structure from FIG. 8 by, for example, an isotropic etching process, such as reactive ion etching (RIE). The excess channel material is removed to remove any residual channel material from the top portion of the structure so that, during subsequent processing steps, a top surface is uniform in both material and topography.

Figure 10:
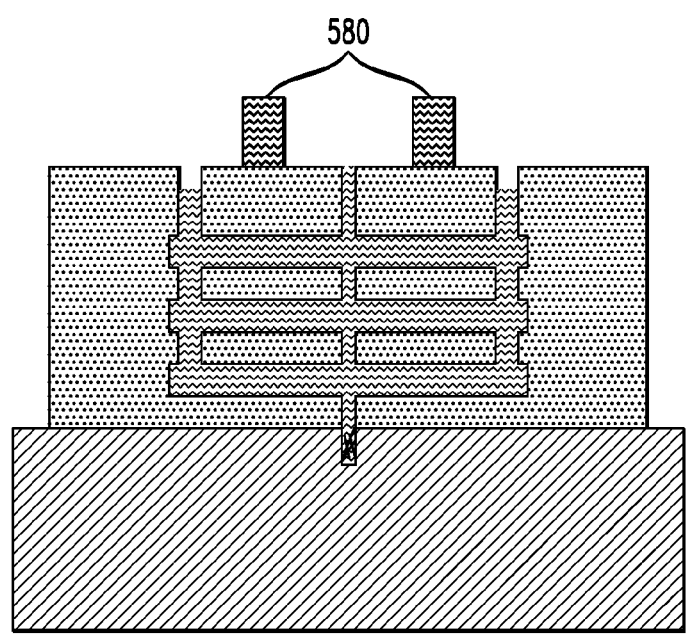
FIG. 10 is a cross-sectional view illustrating fabrication of a semiconductor device taken parallel to a gate extension direction and showing formation of hard masks for patterning stacked nanowires, according to an exemplary embodiment of the present invention.

FIG. 10 is a cross-sectional view illustrating fabrication of a semiconductor device taken parallel to a gate extension direction and showing formation of hard masks for patterning stacked nanowires, according to an exemplary embodiment of the present invention. Referring to FIG. 10, hard masks 580 including, for example, a nitride, oxide, or an organic resist, are formed on the structure from FIG. 9 to cover what is to be a remaining portion of a stacked configuration of dielectric material 110 (and possibly dielectric 210 depending on the extent of the CMP process from FIG. 5) and the channel material 470 after patterning.

Figure 11:
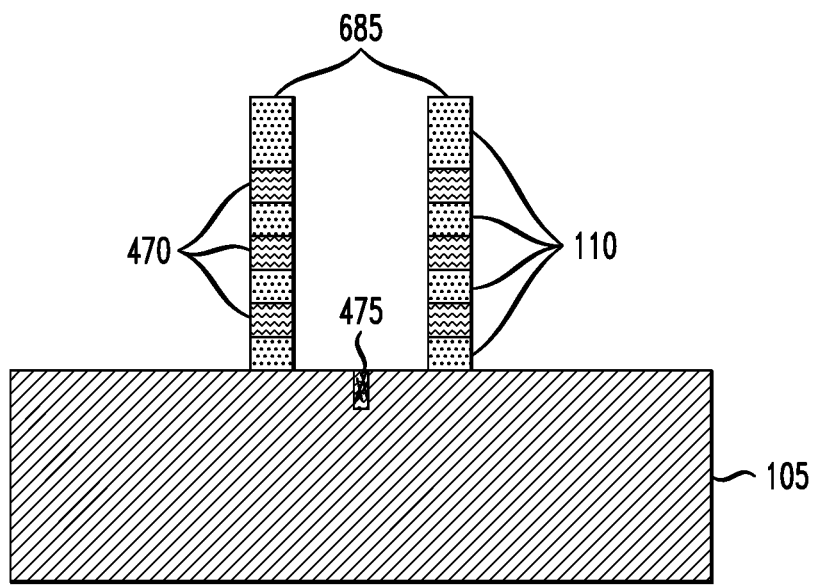
FIG. 11 is a cross-sectional view illustrating fabrication of a semiconductor device taken parallel to a gate extension direction and showing patterning of stacked nanowires, according to an exemplary embodiment of the present invention.

FIG. 11 is a cross-sectional view illustrating fabrication of a semiconductor device taken parallel to a gate extension direction and showing patterning of stacked nanowires, according to an exemplary embodiment of the present invention. Referring to FIG. 11, stacked nanowire patterning is performed to remove exposed portions of the stacked configuration of dielectric material and the channel material not covered by the hard masks 580. In accordance with an embodiment of the present invention, the patterning is performed using, for example, an etching process, resulting in the remaining stacks 685 of dielectric material 110 and the nanowires 470. The etching process includes, for example, an isotropic etch process, for example, RIE, using a plasma etchant, for example: $CF_4$, $SF_6$, $NF_3$, $Cl_2$, $CCl_2F_2$. As can be seen, the portion of the channel material including the defects 475 is contained in the substrate 105. While three layers of nanowires 470 are shown, the embodiments of the present invention are not necessarily limited to the shown number of layers 470, and there may be more or less layers depending on design constraints and the original configuration of the dielectric layers 110 and 120 discussed in connection with FIG. 1.

Figure 12:
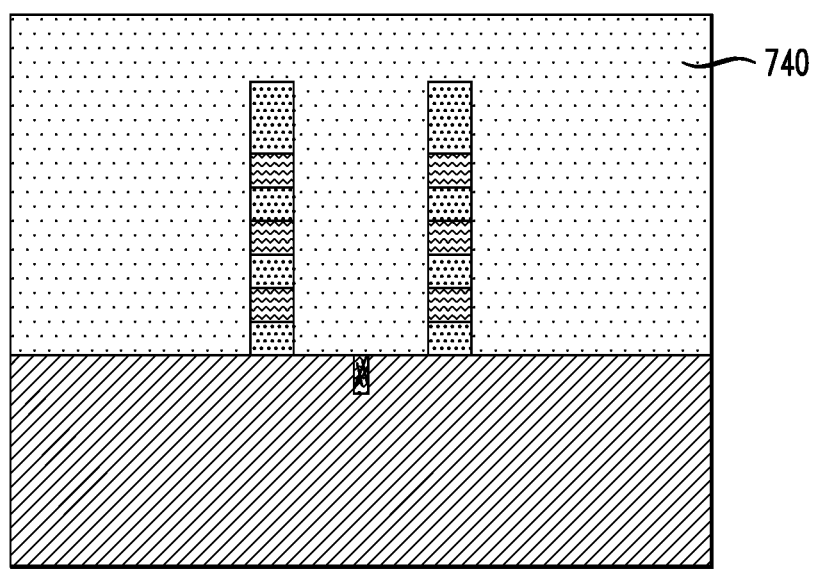
FIG. 12 is a cross-sectional view illustrating fabrication of a semiconductor device taken parallel to a gate extension direction and showing deposition of a sacrificial gate, according to an exemplary embodiment of the present invention.

FIG. 12 is a cross-sectional view illustrating fabrication of a semiconductor device taken parallel to a gate extension direction and showing deposition of a sacrificial gate, according to an exemplary embodiment of the present invention. Referring to FIG. 12, a sacrificial gate 740 and spacers (not shown) for a replacement metal gate (RMG) process are deposited using, for example, deposition techniques including, but not limited to, chemical vapor deposition (CVD), plasma enhanced CVD (PECVD), physical vapor deposition (PVD), atomic layer deposition (ALD), molecular beam deposition (MBD), pulsed laser deposition (PLD), and/or liquid source misted chemical deposition (LSMCD), sputtering, and/or plating. The sacrificial gate 740 can include, for example, polysilicon (poly-Si). In an alternative embodiment, the sacrificial gate 740 is made of, for example, an amorphous silicon material, or other suitable materials.

Figure 13:
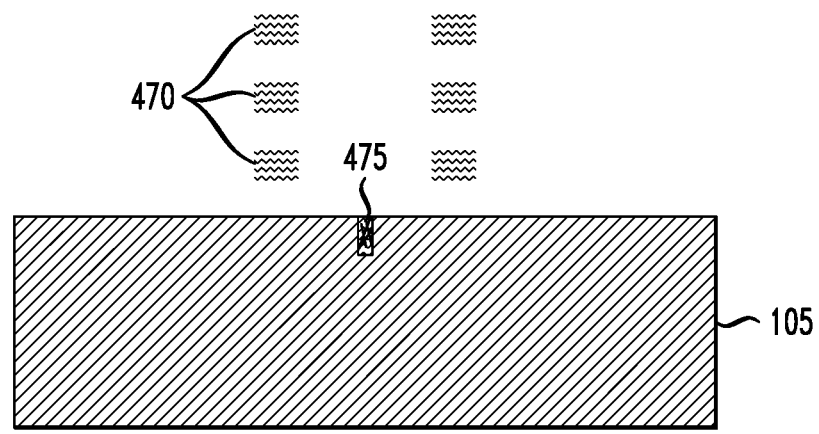
FIG. 13 is a cross-sectional view illustrating fabrication of a semiconductor device taken parallel to a gate extension direction and showing removal of a dummy gate and the dielectric layer adjacent the channel material, according to an exemplary embodiment of the present invention.

FIG. 13 is a cross-sectional view illustrating fabrication of a semiconductor device taken parallel to a gate extension direction and showing removal of a dummy gate and the dielectric layer adjacent the channel material, according to an exemplary embodiment of the present invention. Referring to FIG. 13, in accordance with a replacement metal gate flow, the sacrificial gate 740 is removed by any suitable etching process capable of selectively removing the sacrificial gate 740 to form a gate cavity. The sacrificial gate 740 may be removed by, for example, an RIE process, which can selectively remove silicon to remove a sacrificial gate electrode.

FIG. 13 further illustrates removal of the dielectric material 110 alternately stacked with the nanowires 470. Referring to FIG. 13, the remaining dielectric 110 is stripped, leaving suspended nanowires 470 in the channel region. It is to be understood that the nanowires 470 are supported on the substrate 105 in the S/D regions, with, for example, pads so that the nanowires 470 are not actually "floating" as shown in FIG. 13. With respect to FIG. 13, the S/D regions are located in front and behind coming out of and going into the page if there were three-dimensions depicted.

In accordance with an embodiment of the present invention, the remaining dielectric layers 110 are removed by, for example, a selective etch process. The etch process can be a wet chemical etch process, using for example, dilute hydrofluoric acid.

Figure 14:
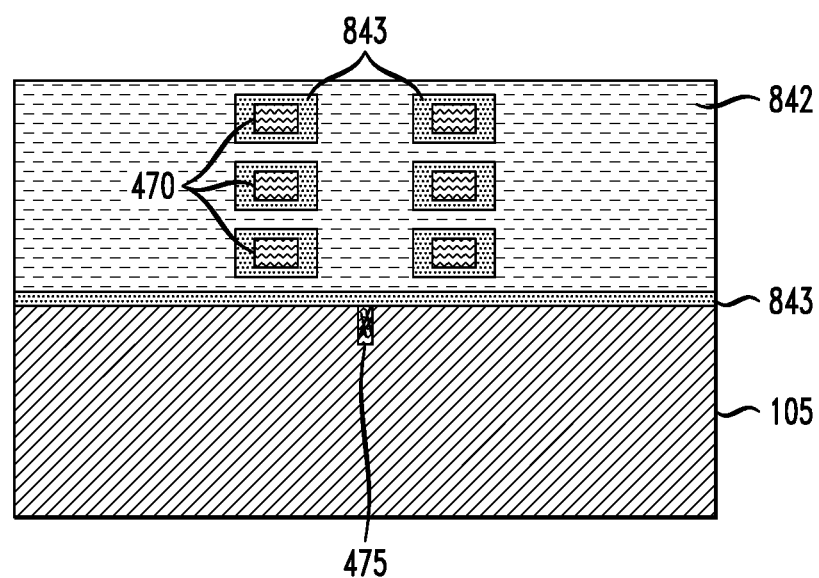
FIG. 14 is a cross-sectional view illustrating fabrication of a semiconductor device taken parallel to a gate extension direction and showing gate and dielectric deposition, according to an exemplary embodiment of the present invention.

FIG. 14 is a cross-sectional view illustrating fabrication of a semiconductor device taken parallel to a gate extension direction and showing gate and dielectric deposition, according to an exemplary embodiment of the present invention. Referring to FIG. 14, a metal gate structure includes, for example, low resistance metal 842, such as, for example, tungsten, zirconium, tantalum, titanium, aluminum, ruthenium, metal carbides, metal nitrides, transition metal aluminides, tantalum carbide, titanium carbide, tantalum magnesium carbide, or combinations thereof, and high-K dielectric 843 such as, for example, $HfO_2$ (hafnium oxide). The metal gate structure may be formed using, for example, deposition techniques including, but not limited to, CVD, PECVD, PVD, ALD, MBD, PLD, and/or LSMCD, sputtering, and/or plating. The resulting gate structure can be planarized using, for example, CMP. As can be seen, the portion of the channel material including the defects 475 is contained in the substrate 105, and the defect free nanowires 470 are surrounded by the gate structure.

FIGS. 15A and 15B are top views of layouts of PFET and NFET semiconductor devices, respectively, according to an exemplary embodiment of the present invention. Referring to FIGS. 15A and 15B, the PFET and NFET devices have essentially the same configuration as each other. According to an embodiment, the stacked nanowires 470 for the PFET device include germanium, and the stacked nanowires 470 for the NFET device include III-V compound semiconductor material. In some embodiments, silicon and silicon germanium (SiGe) can also be used as the channel material for PFETs.

Gate structures 841 including, for example, metal gates 842 and high-K dielectrics 843, are formed perpendicular to the stacked nanowires 470. FIGS. 15A and 15B illustrate left and right trenches 361' and 362', and a center trench 350'. Similar to what is noted in connection with FIG. 6 above, the left and right trenches 361' and 362' are for epitaxial gas outflow, and the center trench 350' is where a seed layer is formed to create a starting point for epitaxial growth of channel material, for example, III-V compound semiconductor material or germanium. The left and right trenches 361' and 362' can correspond to the dimensions of openings 361 and 362 in FIG. 6. FIGS. 15A and 15B show trench 350' in an orientation where, unlike opening 350 in FIG. 6, trench 350' is longer in the horizontal direction than opening 350. Trench 350' can have a similar depth to a depth of opening 350 and a width in the vertical direction which creates a high aspect ratio.

FIGS. 15A and 15B further illustrate the mask 130 from FIG. 2, which is used for shallow trench isolation (STI), and anchor mask 930. The anchor mask 930 is used to anchor the nanowires to an anchor pad when the nanowires are released.

Figure 16A:
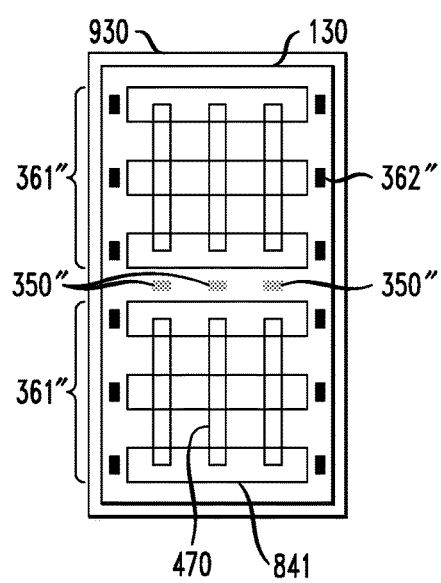
FIGS. 16A and 16B are top views of layouts of PFET and NFET semiconductor devices, respectively, according to an exemplary embodiment of the present invention.
Figure 16B:
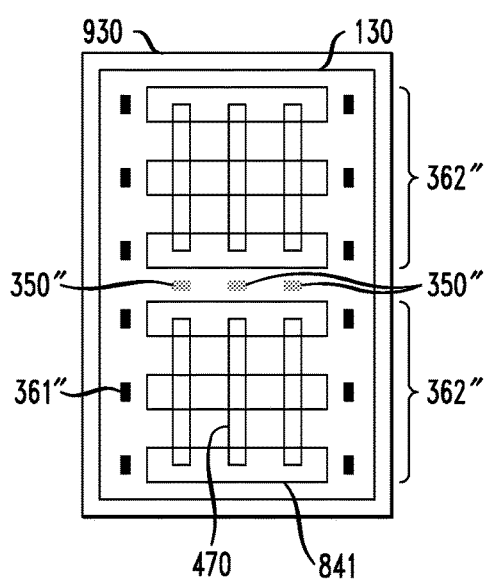

FIGS. 16A and 16B are top views of layouts of PFET and NFET semiconductor devices, respectively, according to an exemplary embodiment of the present invention. Referring to FIGS. 16A and 16B, the PFET and NFET devices have essentially the same configuration as each other. The devices are similar to what is shown in FIGS. 15A and 15B, except that FIGS. 16A and 16B illustrate multiple left and right holes 361" and 362", and multiple center holes 350". Similar to what is noted in connection with FIG. 6 above, the left and right holes 361" and 362" are for epitaxial gas outflow, and the center holes 350" are where seed layers are formed to create starting points for epitaxial growth of channel material, for example, III-V compound semiconductor material or germanium. The holes 350", 361" and 362" can correspond to the dimensions of openings 350, 361 and 362 in FIG. 6. FIGS. 16A and 16B show that a plurality of each of the holes 350", 361" and 362" can be used instead of elongated trenches along vertical and horizontal directions as in FIGS. 15A and 15B. Like FIGS. 15A and 15B, FIGS. 16A and 16B further illustrate the mask 130 from FIG. 2, which is used for STI, and anchor mask 930.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
a substrate;
a plurality of nanowires on the substrate in a stacked configuration, wherein the nanowires comprise a material having a lattice mismatch with a material of the substrate and are free of dislocation defects;
a gate structure formed on the stacked configuration; and
at least one opening in the substrate apart from the stacked configuration, wherein the opening is filled with the material having the lattice mismatch, and containing defects caused by the lattice mismatch.

2. The semiconductor device of claim 1, wherein the material of the substrate comprises silicon and the material of the nanowires comprises one of a III-V compound, a II-VI compound and germanium.

3. The semiconductor device of claim 1, wherein a bottom of the opening is formed in a V-shape.

4. The semiconductor device of claim 1, wherein a top of the opening is at a top surface of the substrate.

5. The semiconductor device of claim 1, wherein a width of the opening is about 10 nm-about 25 nm.

6. The semiconductor device of claim 1, wherein the material of the substrate comprises silicon and the material of the nanowires and in the opening comprises one of a III-V compound, a II-VI compound and germanium.

7. The semiconductor device of claim 1, wherein gate structure comprises a metal formed on a high-K dielectric.

8. A semiconductor device, comprising:
a substrate;
a plurality of channel layers on the substrate in a stacked configuration, wherein the channel layers comprise a semiconductor material having a lattice mismatch with a semiconductor material of the substrate and are free of dislocation defects;
a gate structure formed on the stacked configuration; and
at least one opening in the substrate apart from the stacked configuration, wherein the opening is filled with the semiconductor material having the lattice mismatch, and containing defects caused by the lattice mismatch.

9. The semiconductor device of claim 8, wherein the semiconductor material of the substrate comprises silicon and the semiconductor material of the channel layers comprises one of a III-V compound, a II-VI compound and germanium.

10. The semiconductor device of claim 8, wherein a bottom of the opening is formed in a V-shape.

11. The semiconductor device of claim 8, wherein a top of the opening is at a top surface of the substrate.

12. The semiconductor device of claim 8, wherein a width of the opening is about 10 nm-about 25 nm.

13. The semiconductor device of claim 8, wherein the semiconductor material of the substrate comprises silicon and the semiconductor material of the channel layers and in the opening comprises one of a III-V compound, a II-VI compound and germanium.

14. The semiconductor device of claim 8, wherein gate structure comprises a metal formed on a high-K dielectric.

* * * * *